United States Patent [19]
Merritt

[11] Patent Number: 5,723,999
[45] Date of Patent: *Mar. 3, 1998

[54] REDUNDANT ROW FUSE BANK CIRCUIT

[75] Inventor: Todd Merritt, Boise, Id.

[73] Assignee: Micron Technology, Inc., Boise, Id.

[*] Notice: The term of this patent shall not extend beyond the expiration date of Pat. No. 5,583,463.

[21] Appl. No.: 748,468

[22] Filed: Nov. 8, 1996

Related U.S. Application Data

[63] Continuation of Ser. No. 453,010, May 30, 1995, Pat. No. 5,583,463.

[51] Int. Cl.$^6$ ................................................. G06F 11/16
[52] U.S. Cl. ................................................ 327/526; 327/379
[58] Field of Search ................................ 327/379, 526

[56] References Cited

U.S. PATENT DOCUMENTS 4,689,494  8/1987  Chen et al. ........................... 327/526
4,714,839  12/1987  Chung .................................. 307/441

*Primary Examiner*—Margaret Rose Wambach
*Attorney, Agent, or Firm*—Seed and Berry LLP

[57] ABSTRACT

A row address detection circuit includes a fuse bank, including a plurality of fuses connected to a common node. A precharge circuit is connected to bias the common node at a supply voltage. The fuse bank is also coupled through an isolation circuit to a buffer circuit. Selected ones of the fuses are blown in a pattern corresponding to an address of a defective circuit to enable a redundant circuit to be substituted for the defective circuit. The isolation circuit allows the buffer circuit to measure the node voltage to determine if an input to a group of address select lines corresponds to the address of the defective circuit, yet isolates the buffer circuit from the common node to prevent partially blown fuses from placing an excessive load on the buffer circuit. In one embodiment, the isolation circuit is realized with a pair of transistors of opposite channel type coupled for synchronous switching to provide substantial isolation while minimizing voltage drop.

15 Claims, 4 Drawing Sheets

REDUNDANT ROW FUSE BANK CIRCUIT

CROSS-REFERENCE TO RELATED APPLICATION

This application is a continuation of U.S. patent application Ser. No. 08/453,010, filed May 30, 1996, now U.S. Pat. No. 5,583,463.

TECHNICAL FIELD

The present invention relates to redundant row detection circuits and, in particular, to a fuse-style redundant row address circuit.

BACKGROUND OF THE INVENTION

In many integrated memory arrays, several redundant rows are provided to be used as substitutes for defective rows in the memory. When a defective row is identified, rather than treating the entire chip as defective, a redundant row can be utilized in place of the defective row. The substitution of the redundant row for the defective row is performed by assigning the address of the defective row to the redundant row, such that when an address select signal corresponding to the defective row is received, the redundant row is addressed instead.

To make the substitution of the redundant row for the defective row substantially transparent to a system employing the memory, the memory includes a redundant row detection circuit. The redundant row detection circuit monitors the row addresses and, when the address of the defective row is received, enables the redundant row instead.

One known approach to redundant row detection circuits employs a NOR-style fuse bank. In such circuits, fuses corresponding to address bits are "blown" to produce open circuits on sense lines. The fuses are typically blown by laser-cutting the fuse conductor to eliminate the conductive path through the fuse. In operation, the sense lines are charged and voltage drops across the sense lines in response to a row address select signal are monitored. If the voltage drops across the sense lines correspond to the address of a defective row, the redundant row circuit produces a signal indicating that a redundant row is to be substituted.

Often, the blown fuses are not fully "blown." That is, a slightly conductive path remains through the fuse that allows current to bleed through the fuse. Often, this is a result of the laser-cutting procedure failing to cut all the way through the fuse. As a result of current bleeding through the resistor, the voltage across the fuse may be difficult to maintain, especially when an addressed row remains active for an extended period of time.

If the voltage across the fuses drops below a selected reference voltage, the redundant row circuit determines incorrectly that the blown fuses do not correspond to the address of the defective row. Consequently, the redundant row is not substituted for the defective row and the system may try to store or retrieve data from the defective row.

SUMMARY OF THE INVENTION

A redundant row address detection circuit for an integrated memory device includes a bank of select lines connected to a common node. Each select line includes a fuse and a transistor serially connected between the node and a reference potential. The fuses are selected by address lines connected to the gates of the transistors to selectively couple individual ones of the fuses between the common node and the reference potential. Selected ones of the fuses are blown in a pattern corresponding to the address of a redundant row such that, when the sense lines corresponding to the address of the redundant row are selected, the blown fuses are coupled between the node and ground. In all other cases, the sense lines including unblown fuses are coupled between the common node and the reference potential, bringing the common node to the reference potential.

A precharge circuit is also connected to the common node. The precharge circuit includes a voltage supply connectable to the common node through a switching transistor. In response to a precharge signal, the precharge circuit provides a precharge voltage to the common node. The common node remains substantially at the precharge voltage unless an address other than the redundant row address is supplied to the fuse bank or until current bleeds through partially blown resistors selected in response to the redundant row address.

An isolation circuit connects a buffer circuit to the common node. The isolation circuit allows the buffer circuit to test the voltage at the node after the precharge voltage is removed, but before the node voltage can drop substantially due to current bleeding through partially blown fuses. After the buffer circuit has stored the precharge voltage, the isolator is activated to isolate the buffer circuit from the node, thereby preventing the dropping node voltage from affecting the stored voltage.

In one embodiment, the isolation circuit is formed from a pair of transistors. The first transistor is an N-channel transistor directly coupled to receive the isolation signal. The second transistor is a P-channel transistor connected through an inverter to receive an inverse of the isolation signal. The two transistors are thus simultaneously switchable between open and close states and, in their close states provide substantially no voltage drop between the common node and the buffer signal.

DETAILED DESCRIPTION OF THE INVENTION

Figure 1:
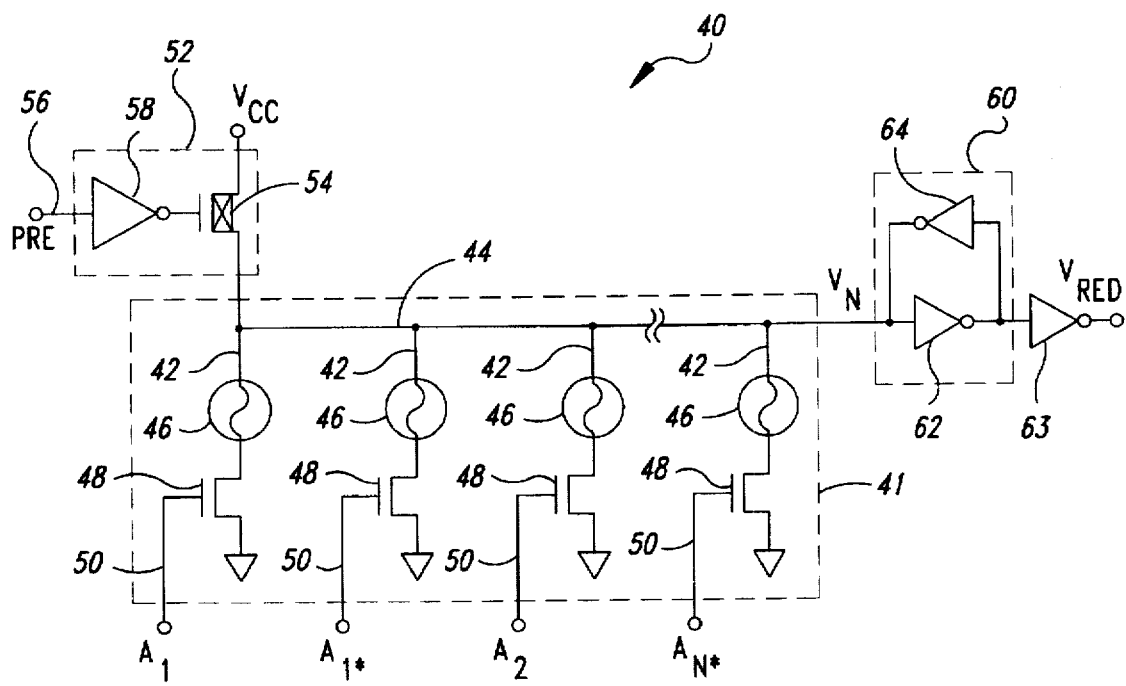
FIG. 1 is a circuit diagram of a prior art row address detection circuit including a fuse bank.

As shown in FIG. 1, a known row detection circuit 40 includes a fuse bank 41 formed from several fuse lines 42 connected to a common node 44. Each of the fuse lines 42 includes a corresponding fuse 46 serially connected with a line select transistor 48. The gate of each line select transistor 48 is controlled by a respective address line 50 with the address lines grouped in complementary pairs. That is, the first two address lines 50 are the A1 and A1* lines corresponding to the first bit of an address and the logical complement of the first bit, respectively. Address bits on the address lines 50 are typically provided by a conventional memory address decoder (not shown) in response to a row address select signal RAS.

Also connected to the node 44 is a precharge circuit 52 including a p-channel precharge transistor 54 coupled between the node 44 and a supply voltage $V_{CC}$. The gate of the p-channel precharge transistor 54 is controlled through an externally supplied precharge signal PRE on a precharge line 56 through an inverter 58. When the precharge signal PRE is high, the gate of the precharge transistor 54 is driven low and the precharge transistor 54 allows the voltage $V_N$ of the node 44 to rise to the supply voltage $V_{CC}$.

In addition to the precharge circuit 52 and the fuse bank 41, a buffer circuit 60 is also coupled to the node 44. The buffer circuit 60 includes a pair of opposed inverters 62, 64 in a common feedback configuration, with the first inverter 62 providing a high voltage if the voltage $V_N$ of the node 44 is below a threshold voltage $V_T$ or a low voltage if the voltage $V_N$ is above the threshold voltage $V_T$. An output inverter 68 inverts the signal from the first inverter 62 to produce an output signal $V_{RED}$ that is high if the node voltage $V_N$ is above the threshold voltage $V_T$ or low if the node voltage $V_N$ is below the threshold voltage $V_T$. The feedback inverter 64 feeds an inverse of the output voltage of the first inverter 62 back to the node 44 to maintain the node 44 at its high or low state. The feedback inverter 64 is selected with a low output current capability to allow the supply voltage $V_{CC}$ from the transistor 54 to overcome the output of the feedback inverter 64 and providing switching as needed.

Figure 2A:
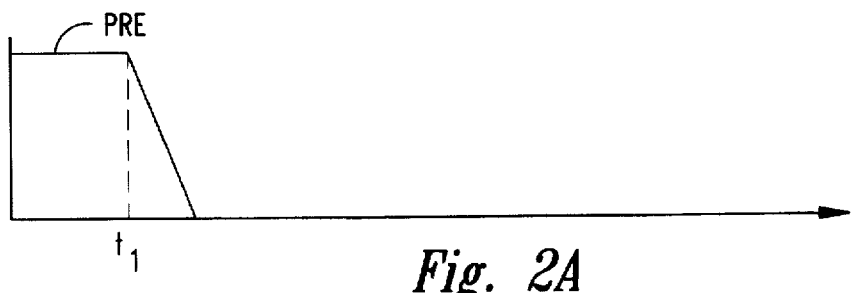
FIG. 2A is a timing diagram of a precharge signal for input to the circuit of FIG. 1.

The operation of the prior art circuit is best explained in conjunction with the timing diagrams of FIGS. 2A–D. As shown in FIG. 2A, prior to detection of a row address, the precharge signal PRE is high such that the transistor 54 is "ON" and the node 44 is substantially at the supply voltage $V_{CC}$. The precharge period ends at a time $t_1$, when the precharge signal PRE goes low. After the end of the precharge period at time $t_1$, the precharge circuit 52 no longer provides the supply voltage $V_{CC}$ to the node 44.

Initially (before the time $t_1$), all of the line select transistors 48 are OFF and substantially no current flows through the fuse lines 42. The voltage $V_N$ at the node 44 is thus maintained at the supply voltage $V_{CC}$ (FIG. 2C). The node voltage $V_N$ is then inverted by the first inverter 62 and re-inverted by the output inverter 68 to an output voltage $V_{RED}$ substantially equal to the supply voltage $V_{CC}$ output (FIG. 2D). After the end of the precharge period (i.e., after time $t_1$), the feedback inverter 64 maintains the node 44 at substantially the supply voltage $V_{CC}$ because neither the precharge circuit 52 nor the fuse lines 42 provide a path for current to exit the node 44 and because the inverter 62 does not substantially load the feedback inverter 64.

Figure 2B:
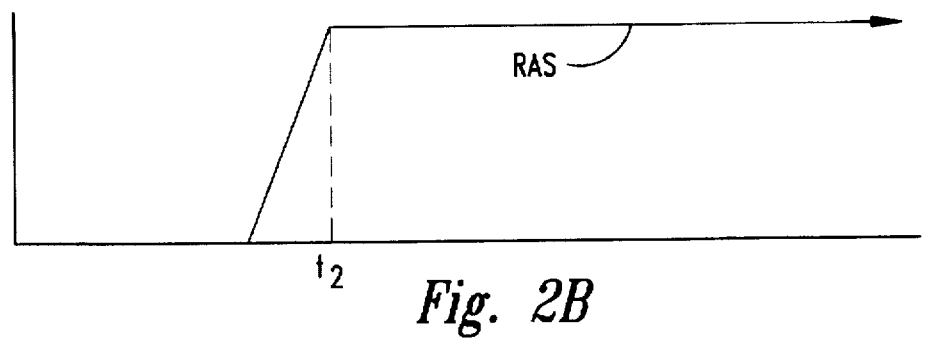
FIG. 2B is a timing diagram of a bit of a row address select signal for input to the circuit of FIG. 1.
Figure 2C:
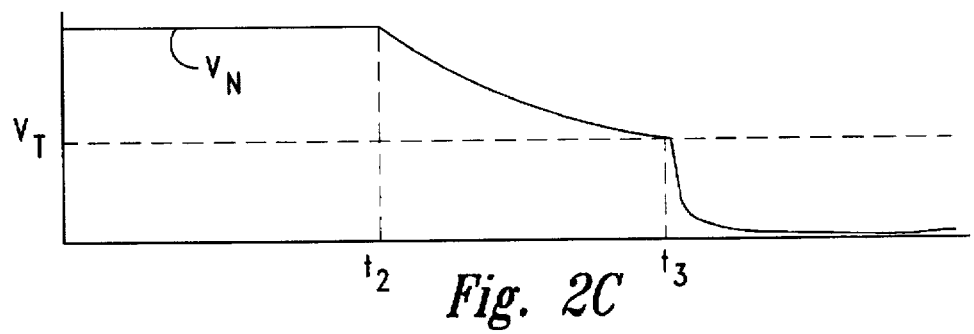
FIG. 2C is a timing diagram of a node voltage at the fuse bank common node within the circuit of FIG. 1 showing a voltage decay response to current bleeding through a partially blown fuse.
Figure 2D:
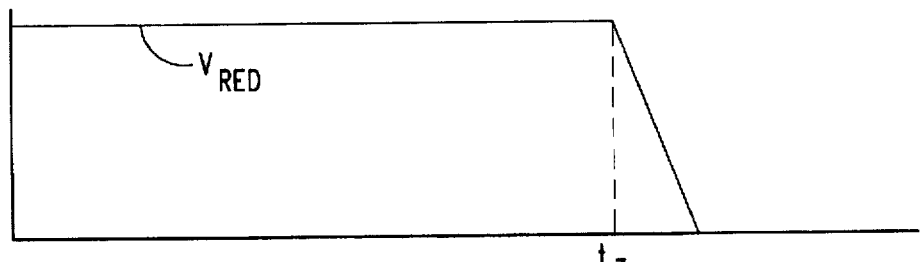
FIG. 2D is a timing diagram of an output signal from the circuit of FIG. 1 showing an incorrect address detection in response to the voltage decay of FIG. 2C.

At a later time $t_2$, after the precharge signal PRE goes low, one bit of a row address signal is applied to each of the address select lines 50, as represented in FIG. 2B. It will understood that only one of the address select lines 50 in each complementary pair will go high. For example, for the first pair A1, A1* of address select lines 50, the first line (the A1 line) of the address select lines 50 will go high if the first bit of the row address elect signal is a "1," turning the corresponding line select transistor 48 ON. In this case, the second line (the A1* line) of the address select lines 50 will be a "0" turning the second line select transistor 48 OFF. Alternatively, the complementary address select line 50 (corresponding to the A1* line) will go high if the first bit of the row address signal is a "0," turning the corresponding line select transistor 48 ON while the first line select transistor 48 (corresponding to the A1 line) will be OFF.

As is conventional, the fuses 46 corresponding to the bits of the row address of the defective row of the memory array are blown by laser cutting the fuse conductor to remove the conductive path through the fuse. The remaining fuses 46 are unblown such that only the fuse lines 42 corresponding to the bits of the address of the defective row contain fuses that are blown. Because each complementary pair of fuse lines 42 corresponds to one bit of the row address and each fuse 46 in the complementary pair corresponds to one state of the bit, one fuse 46 in each pair of fuse lines 42 will be blown and one fuse 46 will be unblown. Thus, if the bits of the row address signal do not correspond exactly to the blown fuses, one of the fuse lines 42 will include an unblown fuse 46 and a line select transistor 48 that is ON, forming a conductive path between the node 44 and the reference potential. Because the feedback inverter 64 has low drive power, it cannot maintain the voltage $V_N$ at the node 44 and the node 44 will therefore be brought to the reference potential, in this case ground. Consequently, the output of the first inverter 62 will be high, and the output signal $V_{RED}$ of the address detection circuit 40 from the output inverter 68 will be low. The low state of the output signal $V_{RED}$ indicates that the decoded address corresponds to the address of an operational row.

If the bits of the row address signal correspond exactly to the blown fuses 46, every address line 42 will contain either a blown fuse 46 or a line select transistor 48 that is OFF. In each case, the sense line 42 forms an open circuit, isolating the node 44 from the reference potential. The feedback inverter 64 maintains the voltage $V_N$ at the node 44 at the supply voltage $V_{CC}$. In this event, the address is for a defective row and a redundant row is then selected.

The above discussion assumes that a blown fuse 46 forms an open circuit on the sense line 42. Quite often, blown fuses 42 do not provide a true open circuit. Instead, some fuses 46 are only partially blown such that they provide a high resistance path for current to bleed from the node 44 to ground. Thus, in the second case above (i.e., where the bits of the row address signal correspond exactly to the blown fuses 46), some current from the node 44 may find a path to bleed current to ground through a partially blown fuse 46 and a line select transistor 48 that is ON. If the current bleeding through the partially blown fuses 46 is sufficient, the feedback inverter 64 cannot maintain the node voltage $V_N$ at the supply voltage $V_{CC}$ and, as shown in FIG. 2C, the node voltage $V_N$ drops gradually. When the node voltage $V_N$ reaches the threshold voltage $V_T$ of the first inverter 62, as shown in FIG. 2C, the output voltage of the first inverter 62 goes high, causing the output signal $V_{RED}$ to go low, as shown in FIG. 2D. Thus, though the bits of the row address signal correspond exactly to the blown fuses 46, indicating a defective address, the decay of the node voltage $V_N$ causes the address detection circuit 40 to incorrectly indicate that the address signal corresponds to a valid row.

Figure 3:
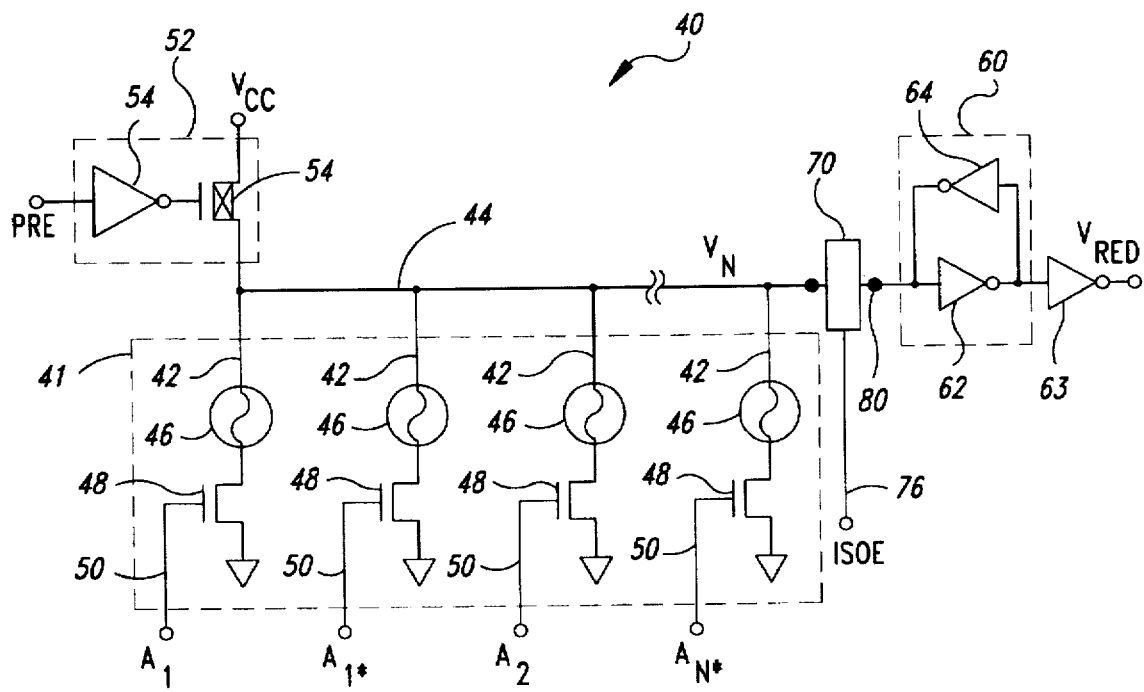
FIG. 3 is a circuit diagram of a row address detection circuit according to the invention including a fuse bank and an isolator.

A redundant row detection circuit 40 according to the invention is shown in FIG. 3. As shown in FIG. 3, a row address detection circuit 40 according to the invention isolates the inverters 62, 64 from the node 44 to overcome the effects of current bleeding through partially blown fuses 46. The row address detection circuit 40 includes the fuse bank 41, the precharge circuit 52, and the buffer circuit 60 as described above, where corresponding components are numbered as in FIG. 1.

As with the previously described circuit 40 of FIG. 1, the precharge circuit 52 and fuse bank 41 are coupled to the node 44 and the fuses 46 are blown according to the address of the defective row as described previously. Unlike the previously described circuit, the node 44 is not connected directly to the buffer circuit 60. Instead, the node 44 is connected to an input of an isolation circuit 70.

The isolation circuit 70 is a selectable circuit that, in one state couples the node 44 to the buffer circuit 60, and in another state electrically isolates the node 44 from the buffer circuit 60. Selection of the state of the isolation circuit 70 is controlled by an isolation enable signal ISOE from the decoder.

Figure 5:
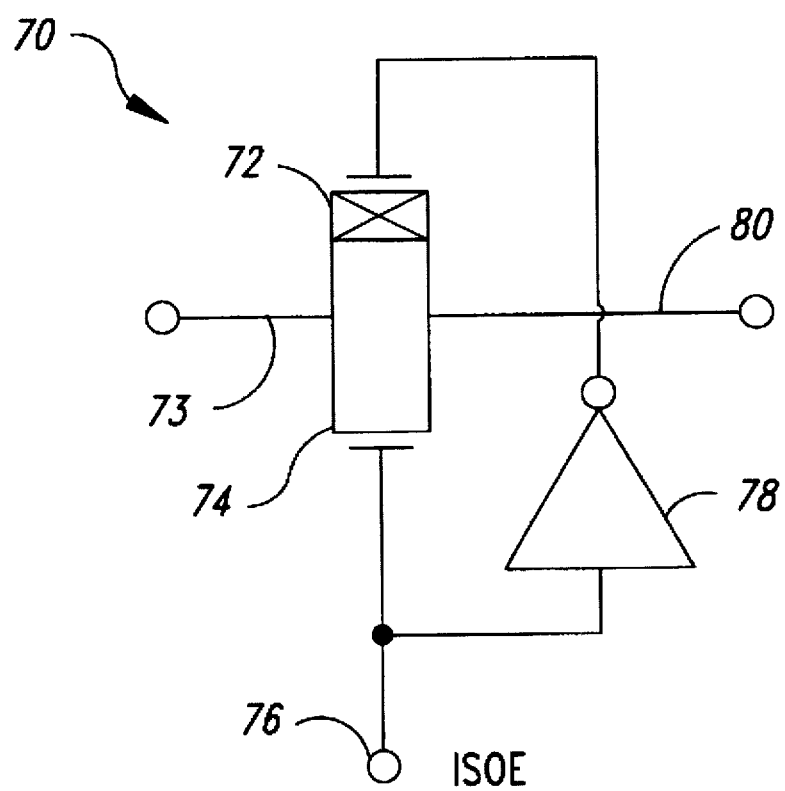
FIG. 5 is a circuit diagram of a portion of the row address detection circuit of FIG. 3 showing the isolator structure.

As shown in more detail in FIG. 5, the isolation circuit 70 includes parallel transistors 72 and 74 of p-channel and n-channel type, respectively, with the sources of the transistors 72 and 74 electrically connected to form a single signal input 73 to the isolation circuit 70. The drains of the transistors 72 and 74 are electrically connected to each other to form a single signal output 75. The signal input 73 is connected to the node 44 and the signal output 75 is connected to the input of buffer circuit 60 (FIG. 3) such that the isolation circuit couples the node 44 to the buffer circuit 60.

The transistors 72 and 74 are switched by the isolation enable signal ISOE through a control input 76 that is directly connected to the gate of the n-channel transistor 72 and is connected to the gate of the p-channel transistor 74 through an inverter 78. The isolation enable signal ISOE can thus switch the transistors 72 and 74 synchronously with a single signal at the control input 76. Because the transistors are of opposite channel type, the full voltage of the node 44 is coupled to the input of the first inverter 62. Alternatively, a single transistor of the n or p channel type or various other isolation logic, such as AND gates, NAND gates or NOR gates, could be used.

Returning to FIG. 3, the operation of the row address detection circuit 40 is best explained in connection with FIGS. 4A-F. During the precharge period (prior to the time $t_1$), the precharge signal PRE to the precharge circuit 52 is high such that the precharge transistor 54 couples the supply voltage $V_{CC}$ to the node 44, maintaining the node 44 at substantially the supply voltage $V_{CC}$. When the precharge signal PRE goes low (after the time $t_1$), the precharge transistor 54 is OFF and the supply voltage $V_{CC}$ is removed from the node 44.

Figure 4A:
FIG. 4A is a timing diagram of the precharge signal for input to the circuit of FIG. 3.
Figure 4B:
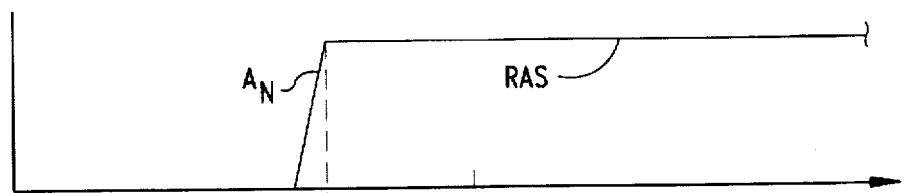
FIG. 4B is a timing diagram of a row address select signal for input to the circuit of FIG. 3.
Figure 4C:
FIG. 4C is a timing diagram of an isolation enable signal for input to an isolator within the row address detection circuit of FIG. 3.

As can be seen in FIG. 4B, at a time $t_2$, after the time $t_1$, the row address select signal RAS goes high, indicating that the address is to be read for possible redundant row addressing. The following discussion assumes that the address is for a defective row and thus the bits of the row address signal correspond identically to the blown fuses 46. As can be seen in FIG. 4C, the isolation enable signal ISOE which is derived from the address decoder and applied to the control input 76 of the isolation circuit 70 is low at the time $t_2$ so that the transistors 72, 74 are ON. The isolation circuit 70 thus provides a voltage $V_{ISO}$ at its signal output 75 substantially equal to the node voltage $V_N$ and the output signal $V_{RED}$ is high.

Figure 4D:
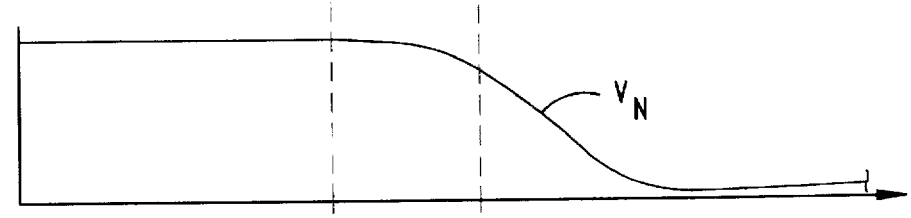
FIG. 4D is a timing diagram of the node voltage at a fuse bank common node within the row address detection circuit of FIG. 3 in response to the signals of FIGS. 4A, B and C.
Figure 4E:
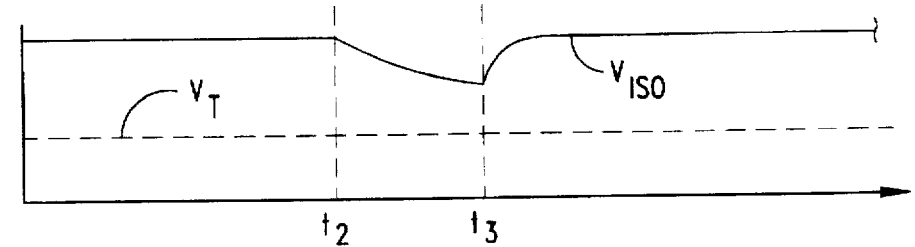
FIG. 4E is a timing diagram of a voltage at an isolated node within the row address detection circuit of FIG. 3 in response to the signals of FIGS. 4A, B and C.

As can be seen in FIG. 4D, after the precharge signal PRE goes low and the node 44 is isolated from the supply voltage $V_{CC}$, the voltage $V_N$ at the node 44 begins to drop due to the current flow from partially blown fuses 46 as described above with respect to FIGS. 1 and 2A-C. The voltage $V_{ISO}$ output from the isolation circuit 70 also begins to drift downwardly, as shown in FIG. 4E. At a time $t_3$, shortly after the row address select signal RAS goes high at the time $t_2$, the isolation enable signal ISOE goes high, as shown in FIG. 4C. The signal ISOE is generated directly from the row address select signal RAS after some selected time delay. The interval from $t_2$ to $t_3$ is a selected time delay generated by any suitable delay circuit, such as a row of inverters or the like.

Figure 4F:
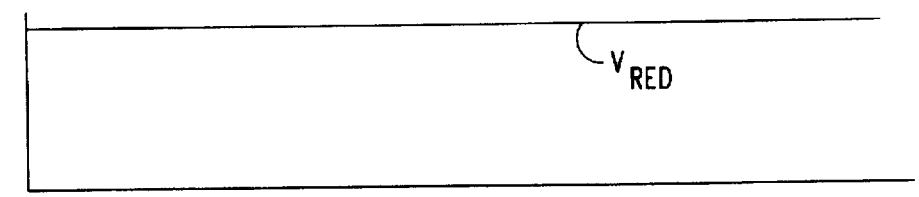
FIG. 4F is an output signal from the row address detection circuit of FIG. 3 in response to the input signals of FIGS. 4A, B and C showing a correct address detection.

When the isolation enable signal ISOE goes high, the transistors 72, 74 are turned OFF and the node 44 is disconnected from the buffer circuit 60 and can draw no current from the feedback inverter 64. Freed from the current draw of the partially blown fuses 46, the feedback inverter 64 brings the voltage $V_{ISO}$ at the signal output 75 of the isolation circuit 70 back up to the supply voltage $V_{CC}$, as shown in FIG. 4E. Consequently, the input to the first inverter 62 never falls below the threshold voltage $V_T$ and the output signal $V_{RED}$ from the output inverter 68 remains high as shown in FIG. 4F, despite the voltage $V_N$ at the node 44 gradually decaying toward the reference voltage. The output signal $V_{RED}$ then correctly indicates that the redundant row is selected, despite current drawn by the partially blown fuses and the decay of the node voltage $V_N$.

It will be appreciated that, although the invention has been illustrated here via an exemplary embodiment, modifications may be made without departing from the spirit and scope of the invention. For example, the isolation circuit 70 may be realized with a single transistor or a NAND-gate latch. Also, the output buffer circuit 60 may be realized in any of a variety of acceptable circuit configurations and any acceptable line selector switch may be used in place of the line select transistors 48. Accordingly, the invention is not limited accept as by the appended claims.

I claim:

1. A blown fuse detection circuit for detecting a blown or unblown state of a fuse having a first end and a second end, comprising:

a precharging circuit configured to provide a test voltage to the first end of the fuse in response to a first control signal;

a buffer circuit having an input terminal, the buffer circuit having a threshold voltage less than the test voltage, the buffer circuit further being responsive to output a voltage of a first state in response to a voltage greater than the threshold voltage at the input terminal and to output a voltage of a second state in response to a voltage less than the threshold voltage at the input terminal;

a reference voltage source configured to provide a reference voltage less than the threshold voltage to the second end of the fuse;

an isolation circuit having an isolation input, the isolation circuit being coupled between the input terminal of the buffer circuit and the first end, the isolation circuit being configured to couple the first end to the buffer circuit in response to an isolation signal of a first state at the isolation input and to present a substantially open circuit to the buffer circuit in response to an isolation signal of a second state at the isolation input; and a control circuit configured to provide the isolation signal of a first state at a first time, the first control signal at a second time and the isolation signal of the second state at a third time following the first and second times.

2. The blown fuse detection circuit of claim 1 wherein the buffer circuit includes an input, an output, and a feedback circuit coupled between the buffer output and the buffer input.

3. The blown fuse detection circuit of claim 2 wherein the feedback circuit has a maximum sustainable feedback current and wherein the substantially open circuit is configured to draw less than the maximum sustainable current.

4. The blown fuse detection circuit of claim 1 wherein the isolation circuit is a switch.

5. The blown fuse detection circuit of claim 4 wherein the switch includes a field effect transistor.

6. A fuse bank circuit comprising:

a bank of fuses;

a bank of switches, each switch being serially coupled to a respective one of the fuses such that the fuses and switches are serially coupled between a node and a reference potential;

a buffer circuit including a forward gain circuit having an input terminal, the buffer circuit further including a feedback circuit having a feedback output coupled to the input terminal, the buffer circuit being switchable from a first state to a second state in response to an input voltage in a first voltage range at the input terminal, the buffer circuit being configured to return to the first state in response to a current draw from the feedback circuit sufficient to produce the input voltage in the first voltage range; and an isolation circuit coupled between the node and the input terminal and switchable to a first state in which the isolation circuit couples the node to the input terminal and a second state in which the isolation circuit selectively blocks current from the feedback circuit from flowing to the node and from flowing into the isolation circuit.

7. The fuse bank circuit of claim 6 wherein the isolation circuit includes a control input add wherein the isolation circuit is responsive to a control signal at the control input to switch from the first state to the second state.

8. The fuse bank circuit of claim 7 wherein the isolation circuit includes an electrically controllable switch that is switchable between a closed and open state in response to the control signal.

9. A method of activating an integrated circuit device including a fuse bank circuit as having a nominally blown fuse coupled between a node and a reference potential, wherein the integrated circuit is configured to operate in a first mode in response to a first input voltage and to operate in a second mode in response to a. second input voltage, comprising the steps of:

applying a test voltage to charge the node;

isolating the node from the test voltage;

after isolating the node from the test voltage, sensing retained voltage at the node;

terminating sensing the retained voltage;

producing either the first or second voltage in response to the sensed voltage;

after terminating sensing the retained voltage, operating the integrated circuit device in the first or second mode in response to the produced first or second voltage; and outputting the produced first or second voltage from before the step of terminating sensing the retained voltage until after completing the step of terminating sensing the retained voltage.

10. The method of claim 9 wherein the step of producing either the first or second voltage in response to the sensed voltage comprises the steps of:

applying the sensed voltage to an input of a buffer circuit having a threshold voltage; and producing the first voltage if the sensed voltage is greater than the threshold voltage; and producing the second voltage if the sensed voltage is less than the sensed voltage.

11. The method of claim 10 wherein the step of producing either the first, or second voltage includes feeding back a signal in response to the produced first or second voltage to an input of the buffer circuit, and wherein the step of outputting the produced first or second voltage from before the step of terminating sensing the retained voltage until after completing the step of terminating sensing the retained voltage, includes the step of isolating the input of the buffer circuit from any input other than the fed back signal.

12. The method of claim 11 wherein the step of isolating the input of the buffer circuit from any input other than the fed back signal comprises the step of imposing a high impedance between the fed back signal and the node.

13. The method of claim 12 wherein the step of imposing a high impedance between the fed back signal and the node comprises the step of opening a switch between the fed back signal and the node.

14. A method of producing a signal indicative of a leaky fuse coupled to a test node, comprising the steps of:

coupling a fuse bank that may contain a leaky fuse to the test node;

at a first time, applying a test voltage to the test node to produce an initial test node voltage;

coupling the initial test node voltage to a buffer input;

producing an output voltage indicative of the initial test node voltage with the output buffer in response to the initial test node voltage;

at a second time following the first time, isolating the buffer input from the test node;

maintaining the output voltage by feeding back a signal corresponding to the output voltage to the buffer input from substantially the first time until after the second time; and after the second time, outputting the output voltage indicative of the initial test node voltage from the output buffer.

15. The method of claim 14 wherein the step of isolating the buffer input from the test node voltage comprises the step of imposing an open circuit to current flow from the buffer input to the test node.

* * * * *